(12) United States Patent
Takatsu et al.

(10) Patent No.: US 7,445,535 B2
(45) Date of Patent: Nov. 4, 2008

(54) ELECTRON SOURCE PRODUCING APPARATUS AND METHOD

(75) Inventors: Kazumasa Takatsu, Inagi (JP); Shigeto Kamata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 490 days.

(21) Appl. No.: 11/000,986

(22) Filed: Dec. 2, 2004

(65) Prior Publication Data
US 2005/0127812 A1 Jun. 16, 2005

(30) Foreign Application Priority Data
Dec. 11, 2003 (JP) ............................. 2003-413470

(51) Int. Cl.
*H01J 9/00* (2006.01)
*H01L 21/00* (2006.01)

(52) U.S. Cl. ..................... 445/62; 445/24; 445/16; 313/311; 313/495; 438/17; 438/20; 427/77

(58) Field of Classification Search ............... None
See application file for complete search history.

(56) References Cited

U.S. PATENT DOCUMENTS

| | | | |
|---|---|---|---|
| 5,622,634 A | 4/1997 | Noma et al. ................. 216/40 |
| 6,000,360 A * | 12/1999 | Koshimizu ............. 118/723 E |
| 6,169,356 B1 | 1/2001 | Ohnishi et al. ............. 313/495 |
| 6,344,711 B1 | 2/2002 | Ohnishi et al. ............. 313/495 |
| 6,384,541 B1 | 5/2002 | Ohnishi et al. |
| 6,554,946 B1 * | 4/2003 | Yamanobe ................. 156/285 |
| 6,582,268 B1 * | 6/2003 | Jindai et al. .................. 445/6 |
| 6,726,520 B2 | 4/2004 | Takeda et al. ................ 445/62 |
| 6,741,087 B2 | 5/2004 | Kimura et al. .............. 324/754 |
| 6,802,752 B1 | 10/2004 | Ohnishi et al. ................ 445/6 |
| 6,890,231 B2 | 5/2005 | Ohnishi et al. ................ 445/6 |
| 2002/0193034 A1 * | 12/2002 | Ota ............................. 445/16 |
| 2003/0052617 A1 | 3/2003 | Ohki et al. ............... 315/169.3 |

(Continued)

FOREIGN PATENT DOCUMENTS

JP 03-162582 7/1991

(Continued)

OTHER PUBLICATIONS

Mead, C.A., *Operation of Tunnel-Emission Devices*, Journal of Applied Physics, vol. 32, No. 4, pp. 646-652 (1961).

(Continued)

*Primary Examiner*—Sikha Roy
(74) *Attorney, Agent, or Firm*—Fitzpatrick, Cella, Harper & Scinto (57) ABSTRACT

An electron source producing apparatus for forming an electron-emission part on a conductive member disposed on a substrate in an atmosphere containing a desired gas. The apparatus includes a container for forming a hermetic atmosphere between the container and a surface of the substrate on which the conductive member is formed. The container has a gas inlet and a gas outlet. A diffusing member is for diffusing an introduced gas, and is disposed between the gas inlet and the surface of the substrate. A resisting member provides exhaust resistance, and is disposed between the gas outlet and the surface of the substrate and is separated from the gas outlet. The resisting member is disposed closer to the surface of the substrate than is the diffusing member.

3 Claims, 4 Drawing Sheets

U.S. PATENT DOCUMENTS

| | | |
|---|---|---|
| 2004/0082249 A1 | 4/2004 | Ohnishi et al. ................. 445/6 |
| 2004/0152388 A1 | 8/2004 | Kimura et al. ................. 445/24 |
| 2004/0164757 A1 | 8/2004 | Kimura et al. ............. 324/754 |
| 2005/0075031 A1 | 4/2005 | Kamata et al. ................. 445/63 |

FOREIGN PATENT DOCUMENTS

| | | |
|---|---|---|
| JP | 05-347282 | 12/1993 |
| JP | 7-235255 | 9/1995 |
| JP | 07-268634 | 10/1995 |
| JP | 8-171849 | 7/1996 |
| JP | 2000-311594 | 11/2000 |

OTHER PUBLICATIONS

Spindt, C.A., et al., *Physical Properties of Thin-Film Field Emission Cathodes with Molybdenum Cones*, Journal of Applied Physics, vol. 47, No. 12, pp. 5248-5263 (1976).

Elinson, M.I., et al., *The Emission of Hot Electrons and the Field Emission of Electrons from Tin Oxide*, Radio Engineering and Electronic Physics, pp. 1290-1296 (1965).

Dyke, W.P. et al., *Field Emission*, Advances in Electronics and Electron Physics, vol. III, pp. 89-184 (1956).

* cited by examiner

DISTANCE BETWEEN GAS INLET
AND DIFFUSING PLATE (mm)

FIG. 6

ELECTRON SOURCE PRODUCING APPARATUS AND METHOD

BACKGROUND OF THE INVENTION

1. Field of the Invention

The present invention relates to apparatuses and methods for producing an electron source and, more particularly, relates to an apparatus and method for producing an electron source having electron emitters.

2. Description of the Related Art

Known electron emitters are broadly divided into two types: thermionic emitters and cold cathode emitters. Examples of cold cathode emitters include field emitters (hereinafter referred to as FEs), metal-insulator-metal emitters (hereinafter referred to as MIM emitters), and surface-conduction electron emitters.

Examples of known FEs include those disclosed in W. P. Dyke and W. W. Dolan, "Field Emission," Advances in Electronics and Electron Physics, 8, 89 (1956) and C. A. Spindt, "Physical Properties of thin-film field emission cathodes with molybdenum cones," J. Appl. Phys., 47, 5248 (1976).

An example of known MIM emitters is disclosed in C. A. Mead, "Operation of Tunnel-Emission Devices," J. Appl. Phys., 32, 646 (1961).

An example of surface-conduction electron emitters is disclosed in M. I. Elinson, Radio Engineering and Electron Physics, 10, 1290 (1965).

Surface-conduction electron emitters utilize a phenomenon in which electrons are emitted by supplying a current across the surface of a small, thin film formed on a substrate. For example, Japanese Patent Laid-Open Nos. 7-235255 and 8-171849, assigned in common with the present application, have proposed novel surface-conduction electron emitters and their application and have disclosed their fundamental structures and manufacturing methods.

According to a typical example of such surface-conduction electron emitters, an electron-emission part is formed on a thin conductive film connected between a pair of device electrodes provided on a substrate by an electrifying process called an energization forming process, in advance, and a subsequent activation process.

The energization forming process is a process of forming a slit having high electrical resistance by applying a voltage across the thin conductive film to break, deform, or modify the film locally.

The activation process is a process of forming a carbon film in the vicinity of the slit by applying a voltage across the thin conductive film in a vacuum atmosphere containing an organic compound. Electrons are emitted from the vicinity of the slit.

Surface-conduction electron emitters, which have a simple structure and are easy to produce as described above, have the advantage that a large number of the devices can be arrayed over a large area. Various applications have therefore been studied to exploit this feature. Examples of such applications include image-forming apparatuses such as charged particle beam sources and displays. An example of applications in which many surface-conduction electron emitters are arrayed is an electron source on which many lines of surface-conduction electron emitters connected in parallel are arrayed.

According to known methods for producing surface-conduction electron emitters, it is effective for improving device characteristics that devices including a pair of electrodes and a conductive film are placed in a vacuum atmosphere, are subjected to the energization forming process, and are supplied with properly selected voltage pulses for several minutes to tens of minutes after the introduction of a gas containing at least one common element with a deposit to be formed on the electron-emission parts into the vacuum atmosphere (the activation process). The activation process improves the characteristics of electron emitters, that is, significantly increases electron-emission current Ie relative to voltage with its threshold maintained.

This activation process, however, has the following problem.

The activation process, in which carbon or a carbon compound is deposited on and around the electron-emission parts, involves the decomposition of an organic compound adsorbed on the device substrate in the atmosphere. A larger number of devices subjected to the activation process at the same time therefore results in a larger amount of organic material decomposed and consumed per unit of time. Such a larger consumption of organic material may vary the concentration of the organic material in the atmosphere, decrease the rate of forming a carbon film, and cause variations over the surface of the substrate, thus impairing the uniformity of the resultant electron source.

SUMMARY OF THE INVENTION

An object of the present invention is therefore to provide a higher yield of electron sources having high uniformity and less variations in device current at low cost. It is another object of this invention to provide an electron source having electron emitters that include a high-crystallinity carbon or carbon compound film formed by an activation process to achieve excellent electron-emission characteristics.

The present invention provides an electron source producing apparatus for forming an electron-emission part on a conductive member disposed on a substrate. This apparatus includes a container for forming a hermetic atmosphere between the container and a surface of the substrate on which the conductive member is formed. The container has a gas inlet and a gas outlet. The apparatus also comprises a diffusing member for diffusing an introduced gas, and being disposed between the gas inlet and the surface of the substrate, and a resisting member for providing exhaust resistance. The resisting member is disposed between the gas outlet and the surface of the substrate and is separated from the gas outlet. The resisting member preferably also is disposed closer to the surface of the substrate than is the diffusing member.

This electron source producing apparatus preferably further includes a gas storage container, that is connected to the gas inlet, for introducing a desired gas into the hermetic atmosphere, a vacuum pump for introducing the desired gas into the hermetic atmosphere, and being connected to the gas outlet, and a power source for applying a voltage to the conductive member in a resulting atmosphere containing the desired gas.

The present invention may further provide an electron source producing method using the above apparatus. This method includes a step of applying the voltage to the conductive member disposed on the substrate in the atmosphere containing the desired gas to form the electron-emission part on the conductive member.

The present invention further provides an electron source producing apparatus for forming a film containing carbon on a conductive member disposed on a substrate to form an electron-emission part. This apparatus includes a container for forming a hermetic atmosphere between the container and a surface of the substrate on which the conductive member is formed. The container also has an inlet and an outlet for a gas containing an organic material. The apparatus also includes a diffusing member for diffusing an introduced gas, and being disposed between the gas inlet and the surface of the substrate, and a resisting member for providing exhaust resistance. The resisting member is disposed between the gas outlet and the surface of the substrate and is separated from the gas outlet. The resisting member also is disposed closer to the surface of the substrate than is the diffusing member.

According to the present invention, the use of an exhaust system having a high effective exhaust rate can provide a predetermined high vacuum in a short time with substantially no local pressure drop. The present invention can therefore provide a deposition apparatus having excellent productivity. In particular, the electron source producing apparatuses according to the present invention can provide a higher yield of electron sources having high uniformity and less variations in device current at low cost, relative to prior art producing apparatuses.

Further objects, features, and advantages of the present invention will become apparent from the following description of the preferred embodiments with reference to the attached drawings.

DESCRIPTION OF THE PREFERRED EMBODIMENTS

Preferred embodiments of the present invention will now be described in detail with reference to the drawings.

Figure 1:
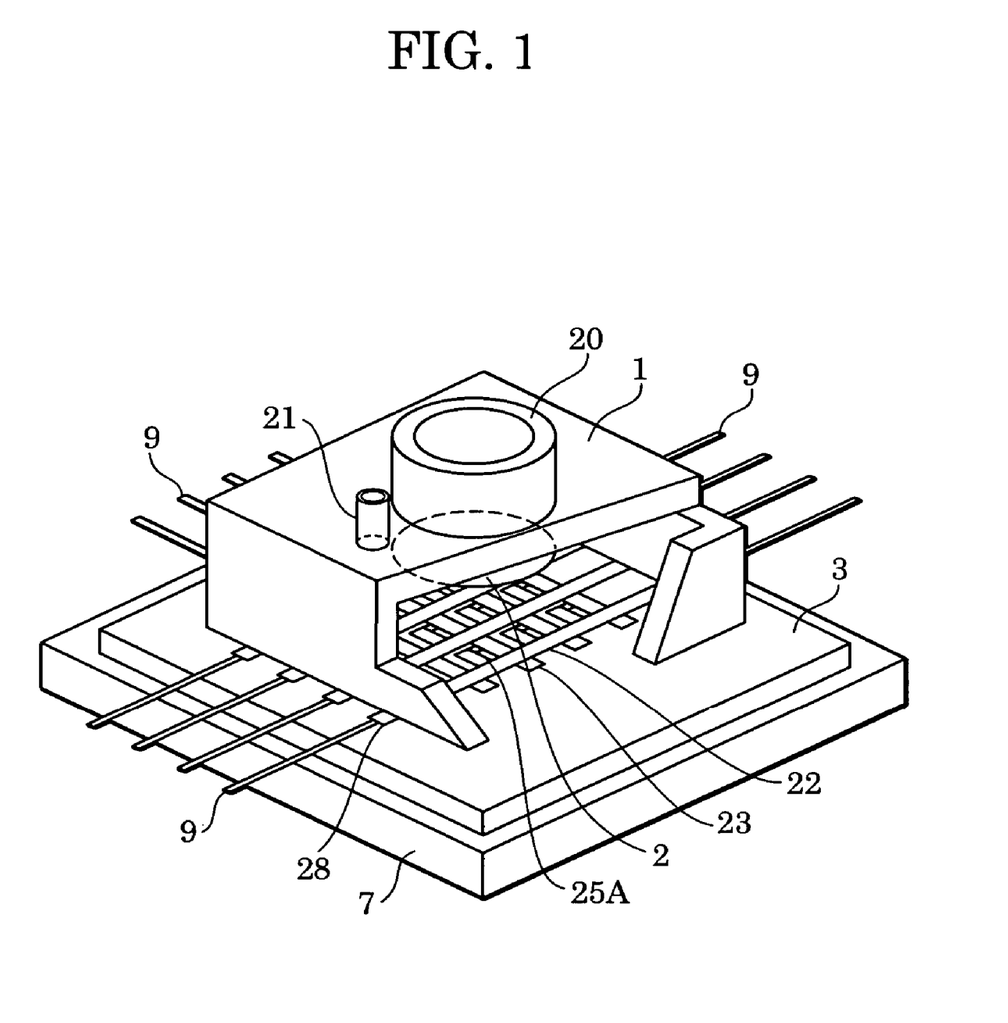
FIG. 1 is a perspective and partial sectional view of a peripheral part of an electron source producing apparatus according to an embodiment of the present invention.
Figure 2:
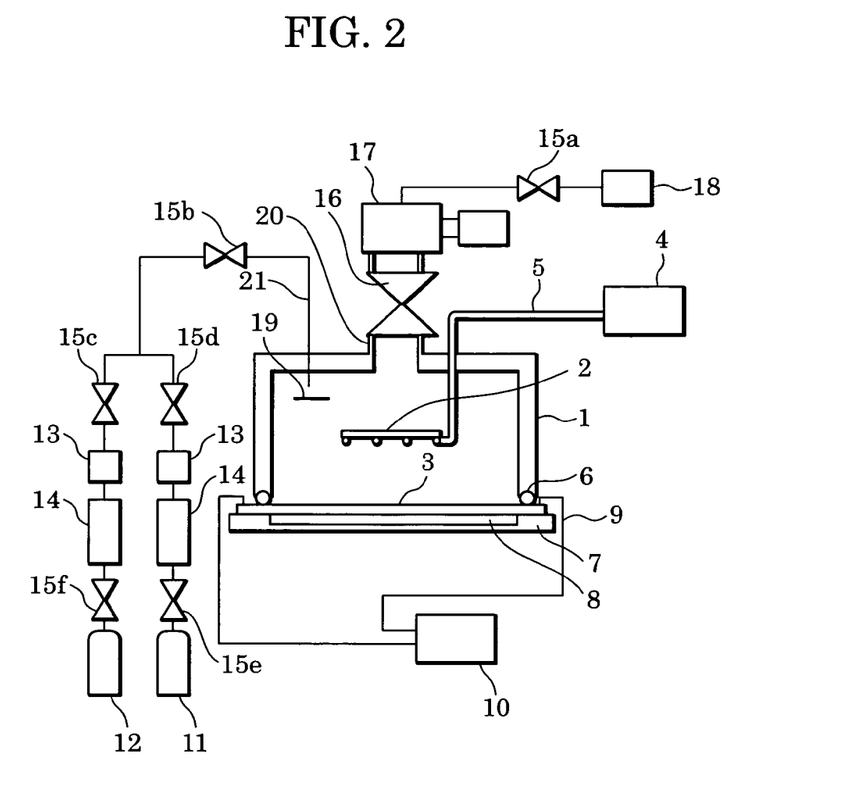
FIG. 2 is a sectional view and piping diagram of the overall structure of the electron source producing apparatus in FIG. 1.
Figure 3:
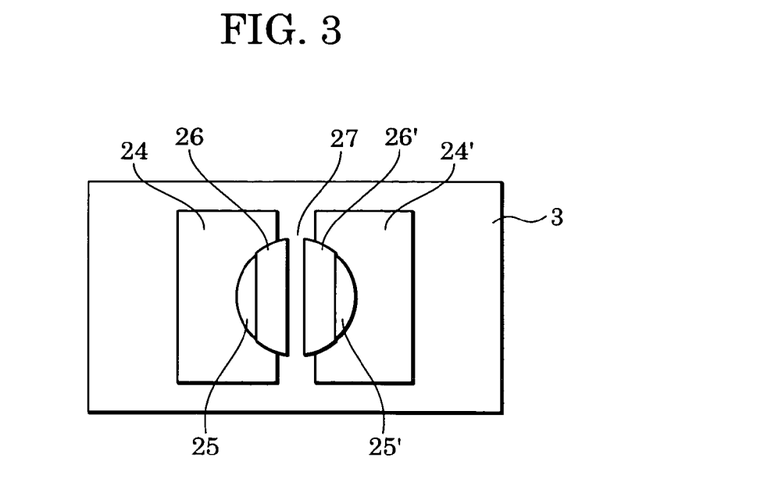
FIG. 3 is a plan view of an example of an electron emitter.

FIGS. 1 and 2 show an electron source producing apparatus according to an embodiment of the present invention. FIG. 1 is a perspective view of the apparatus and shows a substrate and its vicinity on which electron emitters for constituting an electron source are to be formed. FIG. 2 is a sectional view and piping diagram of the apparatus. FIG. 3 is a plan view of an electron emitter formed with the above apparatus.

In FIGS. 1 and 2, a substrate 3 has conductive members 25A on which electron-emission parts are to be formed, X-direction lines 22, Y-direction lines 23, and leads 28 connected with the X-direction lines 22 and the Y-direction lines 23 (for convenience, those connected with the Y-direction lines 23 are not shown in the drawings). The leads 28 of the substrate 3 are connected to a driver 10 (FIG. 2) through lines 9. The driver 10 applies predetermined voltage pulses to the individual conductive members 25A through the X-direction lines 22 and the Y-direction lines 23. The electron source producing apparatus of this embodiment includes a supporter 7 on which the substrate 3 is placed, a container 1 provided on the substrate 3 to form a hermetic atmosphere, a gas inlet pipe 21 for introducing a gas into the container 1, a diffusing plate (diffusing member) 19 for diffusing a jet of gas from an inlet of the container 1, a sealing member 6, a baffle (resisting member) 2 opposed to an outlet of the container 1, a cooling water circulator 4 for cooling the baffle 2, a cooling water pipe 5 for connecting the baffle 2 and the cooling water circulator 4, a heater 8, a gas storage container 11 containing a reducing gas or organic compound gas, another gas storage container 12 containing a carrier gas, water removal filters 14, gas flow control units 13, valves 15a to 15f, a vacuum pump 17, an auxiliary pump 18 for the vacuum pump 17, a gate valve 16, an exhaust pipe 20 for connecting the container 1 and the gate valve 16, the driver 10, which has a power source and a current control system (not shown), and the lines 9, which connect the leads 28 of the substrate 3 with the driver 10.

Referring to FIG. 3, an electron emitter formed on the substrate 3 with the above apparatus includes a pair of device electrodes 24 and 24' opposed to each other and connected to the X-direction lines 22 and the Y-direction lines 23 shown in FIG. 1; a pair of conductive films 25 and 25' connected to the device electrodes 24 and 24', respectively; and carbon films 26 and 26' formed on the conductive films 25 and 25', respectively. The carbon films 26 and 26' define a slit 27 (second slit). The application of a predetermined voltage across the device electrodes 24 and 24' causes the electron emitter in FIG. 3 to emit electrons from around the second slit 27.

In formation of the above apparatus, each conductive member 25A in FIG. 1 is subjected to the energization forming process described above to form a slit (first slit) and the conductive films 25 and 25', which are then subjected to the activation process described above to form the carbon films 26 and 26' on the conductive films 25 and 25' and in the first slit and define the above second slit 27 at the same time.

In FIGS. 1 and 2, the supporter 7 has a mechanism for securing the substrate 3, such as a vacuum chucking mechanism, an electrostatic chucking mechanism, and a fastener (not shown), to mechanically hold the substrate 3. The heater 8 is provided inside the supporter 7 to heat the substrate 3 if necessary.

The container 1 is, for example, a glass or stainless steel container. The container 1 is preferably made of a material that releases little gas. This container 1 covers most of the overall region of the substrate 3 except for part of the leads 28. The container 1 can at least resist a pressure of $1.33 \times 10^{-6}$ Pa ($1 \times 10^{-8}$ Torr) to atmospheric pressure.

The sealing member 6 serves to maintain the hermeticity between the substrate 3 and the container 1. The sealing member 6 used is, for example, an O-ring or a rubber sheet.

Examples of gases introduced into the container 1 include a gas for facilitating the formation of the first slit in the conductive member 25A in the above energization forming process and a source gas for the carbon films 26 and 26' in the above activation process. The gas used in the energization forming process is, for example, a reducing gas such as a hydrogen gas or a mixed gas prepared by diluting a reducing gas with, for example, nitrogen, helium, or argon. The gas used in the activation process is, for example, an organic material or a mixed gas prepared by diluting an organic material with, for example, nitrogen, helium, or argon.

Examples of the organic material used in the activation process include aliphatic hydrocarbons such as alkanes, alkenes, and alkynes, aromatic hydrocarbons, alcohols, aldehydes, ketones, amines, nitrites, phenol, and organic acids such as carboxylic acids and sulfonic acids. More specific examples include saturated hydrocarbons represented by $C_nH_{2n+2}$, such as methane, ethane, and propane; unsaturated hydrocarbons represented by, for example, $C_nH_{2n}$, such as ethylene and propylene; benzene; toluene; methanol; ethanol; acetaldehyde; acetone; methyl ethyl ketone; methylamine; ethylamine; phenol; benzonitrile; and acetonitrile.

If the organic material is a gas at room temperature, it may be directly introduced into the container 1. If, on the other hand, the organic material is a liquid or solid at room temperature, it may be evaporated or sublimated in a container and may be optionally mixed with a dilution gas. The carrier gas introduced into the container 1 is an inert gas such as nitrogen, helium, and argon.

The reducing gas and carrier gas, or the organic material gas and carrier gas, are mixed at a predetermined ratio and are introduced into the container 1. The flow rates and mixing ratio of these gases are controlled by the individual gas flow control units 13, which have, for example, a mass flow controller and an electromagnetic valve (not shown). The mixed gas is optionally heated to a proper temperature with a heater (not shown in the drawings) provided around the gas inlet-pipe 21 and is introduced into the container 1 through the inlet of the container 1. The heating temperature of the mixed gas is preferably equal to the temperature of the substrate 3.

The water removal filters 14 are preferably disposed between the gas flow control units 13 and the gas storage containers 11 and 12 to remove moisture in the gases to be introduced. The water removal filters 14 used are, for example, moisture absorbents such as silica gel, molecular sieves, and magnesium hydroxide.

The mixed gas introduced into the container 1 is exhausted through the exhaust pipe 20 connected to the container 1 with the vacuum pump 17 at a constant exhaust rate to keep the pressure of the mixed gas constant in the container 1. The vacuum pump 17 used is a high-vacuum pump such as a cryopump, which is a capture pump, and a turbo molecular pump, and is preferably oil-free.

In the activation process in this embodiment, the mixed gas preferably has such a pressure that the mean free path $\lambda$ of the molecules of the mixed gas is sufficiently large in comparison with the inner size of the container 1, though the pressure depends on the type of organic material used.

The water content pressure of the atmosphere in the container 1 in the energization forming process and activation process is preferably $1.3 \times 10^{-4}$ Pa ($1.0 \times 10^{-6}$ Torr) or less.

The diffusing plate 19 is preferably provided between the gas inlet pipe 21 and the substrate 3 in the container 1. This diffusing plate 19 controls the flow of the mixed gas to uniformly distribute the reducing gas or organic material gas over the surface of the substrate 3, thus improving the uniformity of the electron-emission efficiency of the resultant electron emitters.

In addition, the baffle 2 is provided between the substrate 3 and the exhaust pipe 20 connected to the container 1 to improve the uniformity of the reducing gas or organic material gas. This baffle 2 is preferably disposed closer to the substrate 3 than the diffusing plate 19 to improve the uniformity of the reducing gas or organic material gas over the surface of the substrate 3.

In this embodiment, pressure in the container 1 for the energization forming process and activation process must be created from atmospheric pressure in a short time to enhance production efficiency; therefore, the vacuum pump 17 is used, which has a high effective exhaust rate, particularly, to water molecules.

Such a high effective exhaust rate may locally drop the pressure on the substrate 3 directly under the exhaust pipe 20, thus adversely affecting the uniformity of the reducing gas or organic material gas. In this embodiment, however, the baffle 2 can prevent the local pressure drop.

Figure 5:
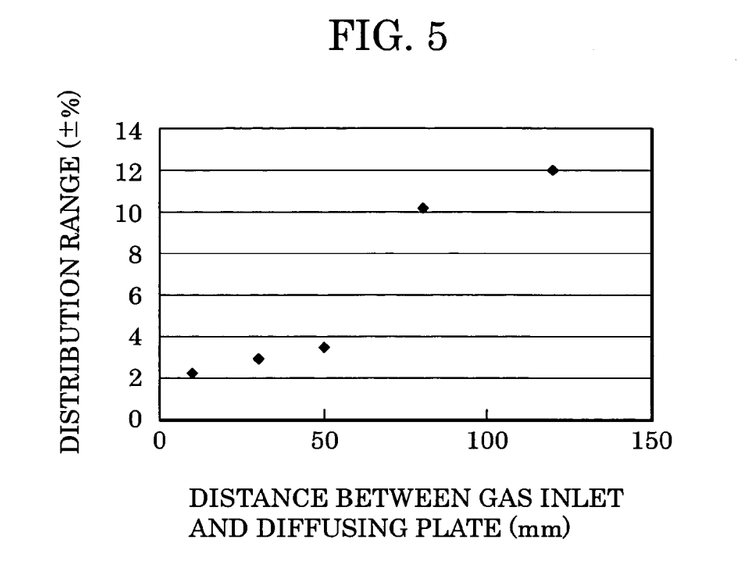
FIG. 5 is a characteristic diagram for showing advantages of the present invention.

FIG. 5 shows the resultant distribution ranges of the organic material gas according to Monte Carlo calculation when the baffle 2 was fixed and the height of the diffusing plate 19 relative to the substrate 3 and the inlet of the container 1 was changed. The distance between the outlet of the container 1 and the substrate 3 was 200 mm. The vacuum pump 17 used had an effective exhaust rate of 3,000 L/sec. The baffle 2 was disposed directly under the outlet of the container 1 at a distance of 60 mm from the outlet. The organic material gas introduced through the gas inlet pipe 21 (4.5 mm in diameter) was an ethylene gas. The distribution ranges were calculated with the diffusing plate 19 disposed at distances of 10 mm, 30 mm, 50 mm, 80 mm, and 120 mm from the inlet of the container 1. The distribution range of each height was plotted.

According to the results, the distribution range of the organic material gas over the substrate 3 was very small, namely not more than ±4%, when the diffusing plate 19 was disposed closer to the surface having the outlet opposed to the substrate 3 than the baffle 2. On the other hand, the distribution range of the organic material gas over the substrate 3 was large when the diffusing plate 19 was disposed farther from the surface having the outlet than the baffle 2. These results show that the distribution range of the organic material gas is not more than ±4% when the baffle 2 is disposed closer to the substrate 3 than the diffusing plate 19, thus indicating excellent productivity.

EXAMPLES

Example 1

Figure 4:
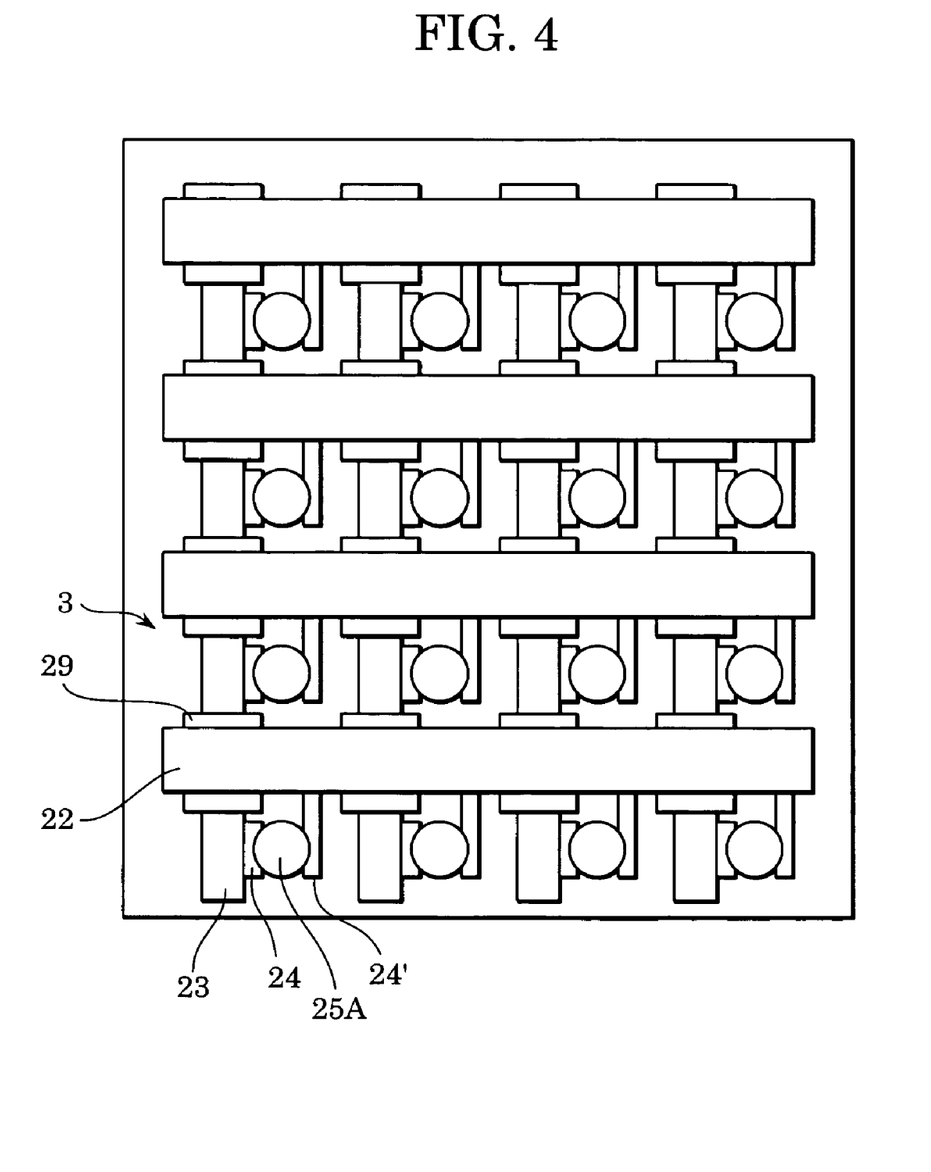
FIG. 4 is a plan view for illustrating an electron source producing method.

In this example, an electron source having surface-conduction electron emitters shown in FIG. 3 was produced with the apparatus according to the present invention. First, a $SiO_2$ layer was formed on the substrate 3, which was made of glass. Pt paste was applied onto the $SiO_2$ layer by printing and was heated and fired to form the device electrodes 24 and 24', as shown in FIG. 4. Ag paste was applied by screen printing and was heated and fired to form the X-direction lines 22 (240 lines) and the Y-direction lines 23 (720 lines) in FIG. 4. An insulating paste was applied onto the intersections of the X-direction lines 22 and the Y-direction lines 23 by screen printing and was heated and fired to form insulating layers 29.

Subsequently, a palladium complex solution was applied dropwise between the device electrodes 24 and 24' with an inkjet apparatus and was heated to form the conductive members 25A, which were made of palladium oxide, shown in FIG. 4. Thus, the substrate 3 was produced on which conductors composed of the device electrodes 24 and 24' and the conductive members 25A were arranged in a matrix and were connected to the X-direction lines 22 and the Y-direction lines 23.

The resultant substrate 3 was fixed on the supporter 7 of the apparatus shown in FIGS. 1 and 2.

The container 1, which was made of stainless steel, was then provided on the substrate 3 with the sealing member 6 disposed therebetween as in FIG. 2 such that at least a portion of leads 28 lay outside the container 1.

The gate valve 16 connected to the outlet of the container 1 through the exhaust pipe 20 was opened to start the exhaustion of the container 1 with the vacuum pump 17. In the energization forming process and the activation process, the substrate 3 was heated with the heater 8 incorporated in the supporter 7. In this example, the vacuum pump 17 used was a cryopump. A cryopump has a significantly high water exhaust rate, namely five or more times as high an exhaust rate as, for example, a turbo molecular pump having the same diameter. This pump can therefore create a high vacuum from atmospheric pressure in a short time even in batch processing.

When this pump is used, radiant heat (from the substrate 3 in this example) to the pump must be blocked. To that end, generally, a water-cooled baffle is provided in an exhaust pipe. This baffle, however, can decrease the conductance of the pipe, thus lowering the effective exhaust rate. As a result, a high vacuum is difficult to create in a short time, and the productivity is decreased.

The baffle 2 not only can improve the uniformity of the distribution of the reducing gas or organic material gas as described above, but also can block the heat to the vacuum pump 17. The vacuum pump 17 can therefore create a high vacuum in a short time with no decrease in the exhaust rate.

In addition, the temperature of the baffle 2, which is heated by the radiant heat from the substrate 3, is controlled by connecting the cooling water circulator 4 to the baffle 2 through the cooling water pipe 5.

After the container 1 was exhausted to not more than $2 \times 10^{-4}$ Pa, the energization forming process was performed by applying a voltage across each conductive member 25A through the X-direction lines 22 and the Y-direction lines 23 with the driver 10, which was connected to the leads 28 through the lines 9. Ten X-direction lines 22 were selected and sequentially supplied with voltage pulses while all Y-direction lines 23 and the unselected X-direction lines 22 were grounded. This process was repeated so that a voltage eventually was applied to each X-direction line 22.

One minute after the beginning of the application of voltage pulses, the valves 15b to 15f for supplying gases and the valve 15a in FIG. 2 were opened to introduce a nitrogen gas containing 2% hydrogen until the pressure in the container 1 finally reached 600 hPa.

The energization forming process was terminated when the conductive members 25A exhibited not less than 1,000 times as high a resistance as before the energization forming process. The resistance of the conductive members 25A was determined by inserting a voltage pulse of about 0.1 V between the voltage pulses for the energization forming process and measuring a current passing through the conductive members 25A at this time. The container 1 was then exhausted.

This energization forming process defined the first slits in the conductive members 25A and therefore formed the pairs of the conductive films 25 and 25' opposed to each other.

The activation process was successively performed with the same apparatus. The valves 15b to 15f for supplying gases and the valve 15a in FIG. 2 were opened to introduce a mixed gas of an organic compound gas and a carrier gas into the container 1. The organic compound gas used was an ethylene-containing nitrogen gas, and the carrier gas used was a nitrogen gas. The valve 15a was adjusted according to a vacuum gauge (not shown in the drawings) such that the pressure in the container 1 was $1.3 \times 10^{-4}$ Pa.

After the introduction of the mixed gas, the activation process was performed by applying a voltage across each pair of the conductive films 25 and 25' through the X-direction lines 22 and the Y-direction lines 23 with the driver 10. Ten X-direction lines 22 were selected and sequentially supplied with voltage pulses while all Y-direction lines 23 and the unselected X-direction lines 22 were grounded. This process was repeated so that a voltage eventually was applied to each X-direction line 22. On the completion of the activation process, a device current If (a current passing across the device electrodes 24 and 24' of each electron emitter) was measured for each X-direction line 22. A comparison of the device currents If showed less variations between the X-direction lines 22, meaning that the activation process was successful.

After the activation process, the carbon films 26 and 26', which were separated by the slit 27, were formed on each electron emitter, as shown in FIG. 3.

In addition, after the activation process, a gas analysis was performed on the side of the exhaust pipe 20 with a mass spectrometer having a differential pumping unit (not shown in the drawings). This analysis showed that the amount of m/z (mass number)=28, namely nitrogen and ethylene, and the amount of m/z (mass number)=26, namely a fragment of ethylene, were instantaneously increased and saturated at the same time as the introduction of the mixed gas, and were constant during the activation process.

Example 2

Figure 6:
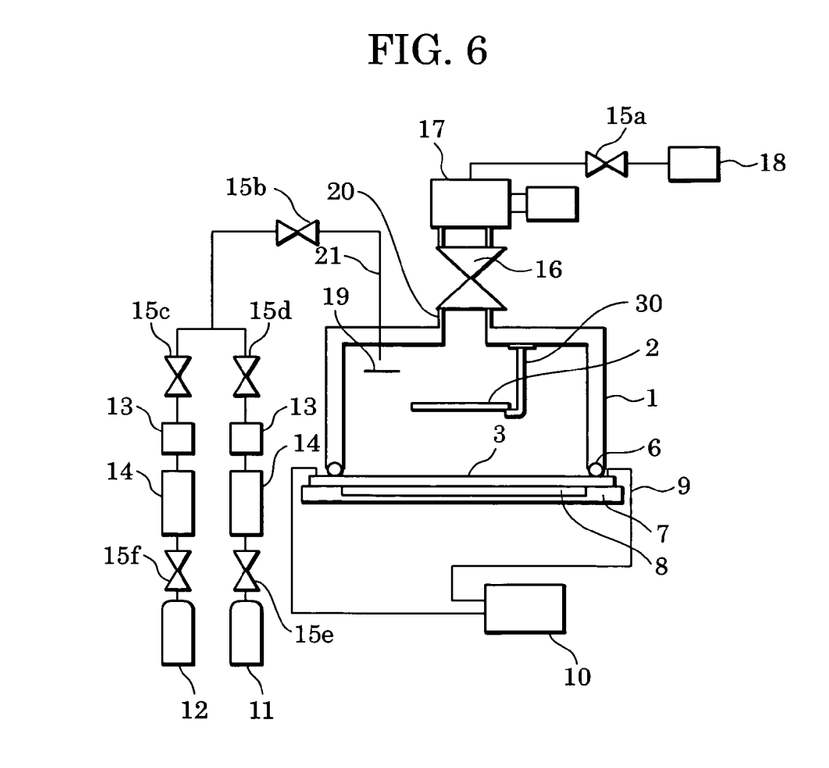
FIG. 6 is a sectional view and piping diagram of an electron source producing apparatus according to another embodiment of the present invention.

The substrate 3 on which the conductive members 25A were arranged in a matrix in FIG. 4 was produced as in Example 1, and was placed in another electron source producing apparatus in FIG. 6. In this example, the baffle 2 to be disposed directly under the exhaust pipe 20 was subjected to surface treatment.

The surface-treated baffle 2 used in this example was a nickel-plated copper baffle. The surface of the baffle 2 is exposed to atmospheric pressure and is therefore oxidized during the replacement of the substrate 3. This oxidation increases the emissivity of the baffle 2 (to not less than 0.6), thus increasing the heat gain of the vacuum pump 17. As a result, the exhaust capacity of the vacuum pump 17 is decreased or the vacuum pump 17 is disabled when, particularly, the vacuum pump 17 used is a cryopump. A combination of copper and nickel, which have similar linear expansivities, can prevent the peeling of the plating. The plating had a thickness of not less than 10 μm.

The baffle 2 can therefore maintain low emissivity to block the radiant heat from the substrate 3 and prevent itself from rising in temperature.

In this example, as in Example 1, the carbon films 26 and 26', which were separated by the slit 27, were formed in each electron emitter, as shown in FIG. 3, after the energization forming process and the activation process. Measurement of the device current If after the activation process as in Example 1 showed variations of about 5%, meaning that the energization forming process and the activation process could be uniformly performed.

The present invention can be applied to deposition apparatuses for depositing a film on a substrate and apparatuses for producing an electron-emission part on a conductive member disposed on a substrate.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2003-413470 filed Dec. 11, 2003, which is hereby incorporated by reference herein.

What is claimed is:

1. An electron source producing method comprising the steps of:

providing a substrate having a conductive member on its surface;

disposing a container having a gas inlet and a gas outlet on said substrate surface having said conductive member such that said inlet and said outlet oppose to said conductive member; and introducing a gas from said inlet in a state that a diffusion member is disposed opposing to said substrate surface between said inlet and said substrate and exhausting a gas from said outlet in a state that a resisting member is disposed opposing to said substrate surface between said outlet and said substrate, to form a gas atmosphere between said substrate and said container, wherein said resisting member is disposed closer to said substrate than is said diffusion member.

2. The electron source producing method according to claim 1, wherein the gas is a reducing gas.

3. The electron source producing method according to claim 1, wherein the gas is an organic material gas.

* * * * *